United States Patent [19]
Fujisawa et al.

[11] Patent Number: 6,094,356
[45] Date of Patent: Jul. 25, 2000

[54] SEMICONDUCTOR DEVICE AND SEMICONDUCTOR DEVICE MODULE

[75] Inventors: Tetsuya Fujisawa; Mitsutaka Sato, both of Kawasaki; Kazuhiko Mitobe, Niigata; Katsuhiro Hayashida, Kawasaki; Masaaki Seki, Kawasaki; Seiichi Orimo, Kawasaki; Toshio Hamano, Kawasaki, all of Japan

[73] Assignee: Fujitsu Limited, Kawasaki, Japan

[21] Appl. No.: 09/008,305

[22] Filed: Jan. 16, 1998

[30] Foreign Application Priority Data

Jun. 4, 1997 [JP] Japan ................................. 9-146677

[51] Int. Cl.⁷ .................................................. H05H 7/12
[52] U.S. Cl. ........................ 361/773; 257/678; 257/696; 361/783
[58] Field of Search .................... 257/666, 678, 257/685, 686, 692, 696, 693, 697, 723, 724, 772, 773, 777, 779, 781; 361/735, 744, 760, 764, 773, 774, 776, 783, 784

[56] References Cited

U.S. PATENT DOCUMENTS

| | | | |
|---|---|---|---|
| 4,992,908 | 2/1991 | Solomon | 361/400 |
| 5,019,943 | 5/1991 | Fassbender et al. | 361/396 |
| 5,200,364 | 4/1993 | Loh | 257/696 |
| 5,239,447 | 8/1993 | Cotuer et al. | 361/744 |
| 5,260,601 | 11/1993 | Baudouia et al. | 257/678 |
| 5,327,327 | 7/1994 | Frew et al. | 361/760 |
| 5,349,541 | 9/1994 | Kawakami | 361/776 |
| 5,444,294 | 8/1995 | Suzuki | 257/666 |
| 5,451,815 | 9/1995 | Taniguchi et al. | 257/696 |
| 5,471,097 | 11/1995 | Shibata | 257/787 |
| 5,726,492 | 3/1998 | Suzuki et al. | 257/685 |

FOREIGN PATENT DOCUMENTS

| | | |
|---|---|---|
| 0 531 724 A1 | 3/1993 | European Pat. Off. . |
| 4-241447 | 8/1992 | Japan . |
| 6-350015 | 12/1994 | Japan . |
| 7-201928 | 8/1995 | Japan . |
| 8-116022 | 5/1996 | Japan . |
| 9-22959 | 1/1997 | Japan . |

OTHER PUBLICATIONS

Copy of European Patent Office Communication for European Patent Application No. 98300242 date Mar. 3, 2000 including European Search Report.
Copy of Korean Patent Office Communication for Korean Patent Application No. 519980964415 dated Feb. 25, 2000.

*Primary Examiner*—Gregory Thompson
*Attorney, Agent, or Firm*—Armstrong, Westerman, Hattori, McLeland & Naughton

[57] ABSTRACT

A semiconductor device including a semiconductor chip, connection parts arranged along one end of the semiconductor chip, and external connection terminals connected to the connection parts.

4 Claims, 13 Drawing Sheets

SEMICONDUCTOR DEVICE AND SEMICONDUCTOR DEVICE MODULE

BACKGROUND OF THE INVENTION

1. Field of the Invention

The present invention generally relates to semiconductor devices and semiconductor device modules, and more particularly to a semiconductor device and a semiconductor memory module which can suitably be used as a high-speed performance memory and a high-speed performance memory module, respectively.

A graphic process executed in office automation devices such as a personal computer and a workstation has been required to process a huge amount of information in a short time. Hence, there has been considerable activity in speeding up a semiconductor memory device and increasing the storage capacity. Also, the semiconductor memory device has been required to operate at a higher frequency and have a package structure suitable for high-frequency operation.

2. Description of the Related Art

Generally, the capacity of the memories built in the office automation devices is attempted by adding a new semiconductor memory device module thereto or replacing the old module by new one. Usually, such a semiconductor memory device module is called a SIMM (Single Inline Memory Module), which has a circuit board on which semiconductor memory devices such as DRAM devices are mounted. Terminals are provided along one end of the circuit board. The module can be detachably attached to a socket provided in the office automation devices.

The semiconductor memory devices are designed to terminals (leads) for external connection as short as possible in order to make it possible to operate the devices at a higher speed. For example, the following package structures are known: LCC (Leadless Chip Carrier), QFN (Quad Flat Non-leaded package), QFJ (Quad Flat J-leaded package), and SOJ (Small Outline J-leaded package).

The LCC and QFN have a high-speed-oriented package structure in which no leads are provided but electrode pads for soldering are provided to a resin package. The QFJ and SOJ have another high-speed-oriented package structure having J-shaped leads extending from a resin package in order to shorten the leads.

However, the semiconductor devices having the above-mentioned package structures have the following disadvantages. The leads and electrode pads (hereinafter referred to as lead members generally) are not connected directly to a semiconductor chip but are connected by using wires. Hence, in a state in which the semiconductor devices are mounted on a circuit board, the lead members and the wires exist in the electrical transmission lines between the semiconductor chips and the connecting points on the circuit board. Thus, the electrical transmission lines have a large electrical resistance (impedance).

The semiconductor chip is completely buried in the resin package, so that there is a long distance between the semiconductor chip and the outer circumference of the resin package (that is, the positions of the lead members). This arrangement also increases the electrical resistance.

When the semiconductor device having any of the above-mentioned structures is operated in synchronism with a clock signal having a very high frequency, the electrical transmission lines have a large loss, so that a desired processing speed cannot be realized.

One may consider increasing the area of the lead members and the diameter of the wires in order to reduce the electrical resistance. However, such an increase increases the size of the semiconductor devices and does not satisfy down-sizing and thinning demanded by the users.

SUMMARY OF THE INVENTION

It is a general object of the present invention to provide a semiconductor device and a semiconductor device module in which the above disadvantages are eliminated.

A more specific object of the present invention is to provide a down-sized semiconductor device and a down-sized semiconductor device module enabling a reduced electrical resistance of electrical transmission lines.

The above objects of the present invention are achieved by a semiconductor device comprising: a semiconductor chip; connection parts arranged along one end of the semiconductor chip; and external connection terminals connected to the connection parts. This structure realizes a low electrical resistance of the external connection terminals themselves and shortened transmission lines. Hence, the transmission lines have a reduced loss even if the semiconductor device is operated at a high-frequency clock signal, so that the semiconductor device enables a high-speed process. Since the external connection terminals are connected directly to the connection parts of the semiconductor chip, down-sizing of the semiconductor device is achieved.

The semiconductor device may further comprise a protection member which covers a circuit formation surface of the semiconductor chip. The protection member prevents the circuit formation surface from being damaged, and the reliability of the semiconductor device can be improved.

The semiconductor device may be configured so that the protection member holds the external connection terminals. The protection member also functions to protect the external connection terminals.

The semiconductor device may be configured so that the external connection terminals have bent portions which are inclined at an angle with respect to a circuit formation surface of the semiconductor chip. This structure contributes to reducing the height of the semiconductor device which is mounted on a mounting board.

The semiconductor device may further comprise a spacer provided between the bent portions of the external connection terminals and an outer circumference of the semiconductor chip, the spacer having a slope corresponding to the angle. Hence, the semiconductor device can certainly be held on the mounting board.

The semiconductor device may be configured so that the bent portions of the external connection terminals are fixed to an outer circumference of the semiconductor chip. Hence, it is possible to prevent occurrence of an interference between adjacent external connection terminals even when the pitch between the adjacent external connection terminals becomes narrow.

The semiconductor device may further comprise protrusion electrodes provided on outer surface portions of the bent portions. The protrusion electrodes improve electrical connections between the semiconductor device and the mounting member.

The semiconductor device may further comprise protrusion electrodes joining the connection parts and the external connection terminals together. The above protrusion electrodes improve the electrical resistance of the connection parts and certainly connect the connection parts to the external connection terminals.

The semiconductor device may further comprise the external connection terminals are thermally crimped to the connection parts. Hence, easy and simplified connecting work can be realized.

The semiconductor device may further comprise a holding board which is separated from the semiconductor chip and holds the external connection terminals. Hence, the external connection terminals can be protected. Further, the external connection terminals can be arbitrarily arranged on the holding board, so that the degree of freedom in design of wiring in the semiconductor device can be improved.

The semiconductor device may be configured so that the holding board has a multi-layer wiring structure. This contributes to improving the degree of freedom in design of wiring.

The semiconductor device may further comprise a heat radiating member, which contributes to efficiently and effectively radiating heat generated in the semiconductor chip.

The semiconductor device may further comprise a heat radiating member facing the protection member. Hence, heat generated in the circuit formation surface is caused to conduct to the heat radiating member via the protection member, so that the heat radiating efficiency can be further improved.

The semiconductor device may be configured so that the heat radiating member has an extension which extends outwards from the semiconductor chip. The extension functions as a positioning reference when the semiconductor device is mounted on the mounting board, so that the mounting work can be improved.

The semiconductor device may be configured so that: the semiconductor chip can be mounted on a mounting board so as to stand vertically; and the semiconductor chip has a memory chip.

The semiconductor device may be configured so that the heat radiating member comprises a supporting portion extending to end positions of the external connection terminals. The semiconductor chip is supported by not only the external connection terminals but also the heat radiating member.

The above objects of the present invention are also achieved by a semiconductor module comprising: a plurality of semiconductor devices arranged side by side, each of the semiconductor devices comprising: a semiconductor chip; connection parts arranged along one end of the semiconductor chip; and external connection terminals connected to the connection parts. Hence, a down-sized, highspeed, high-capacity semiconductor device module can be realized.

The semiconductor device module may further comprise protection members which cover circuit formation surfaces of the respective semiconductor chips, wherein the protection members have adhesiveness and join adjacent semiconductor devices together. Hence, it is possible to reduce the number of components and the number of production steps.

The semiconductor device module may further comprise: a carrier which houses the plurality of semiconductor devices; and a heat radiating member which is thermally coupled with the plurality of semiconductor devices and cover upper portions of the plurality of semiconductor devices. Hence, the semiconductor devices can be certainly placed in a position and an improved heat radiating efficiency can be obtained.

Further, each of the semiconductor devices in the module may be configured as described above.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
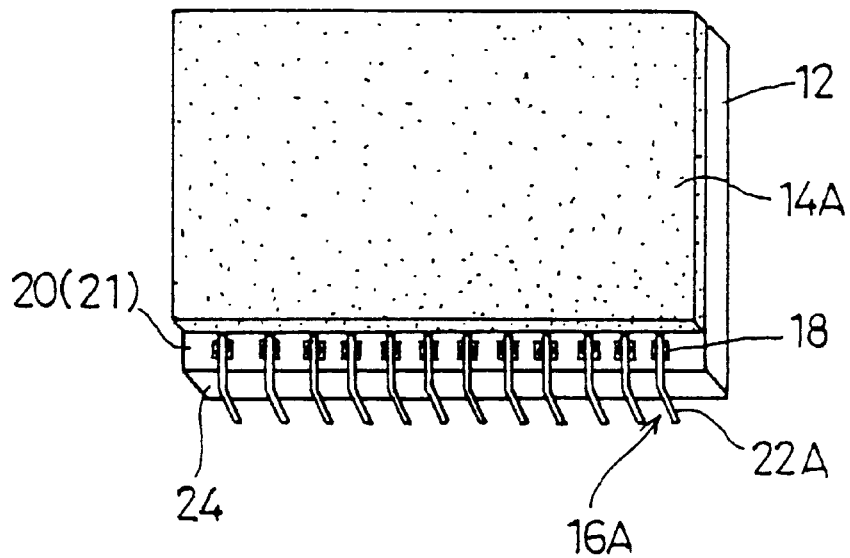
FIG. 1 is a perspective view of a semiconductor device according to a first embodiment of the present invention.
Figure 2:
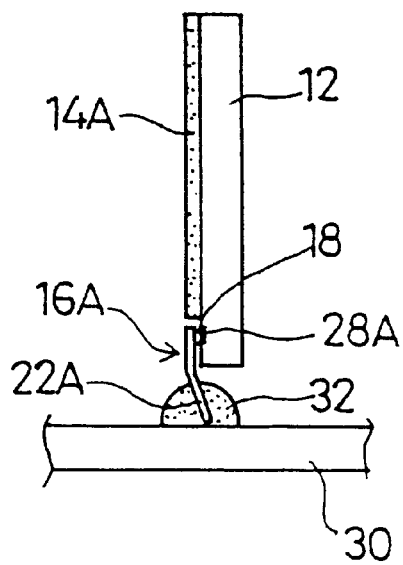
FIG. 2 is a side view of the semiconductor device according to the first embodiment of the present invention.
Figure 3:
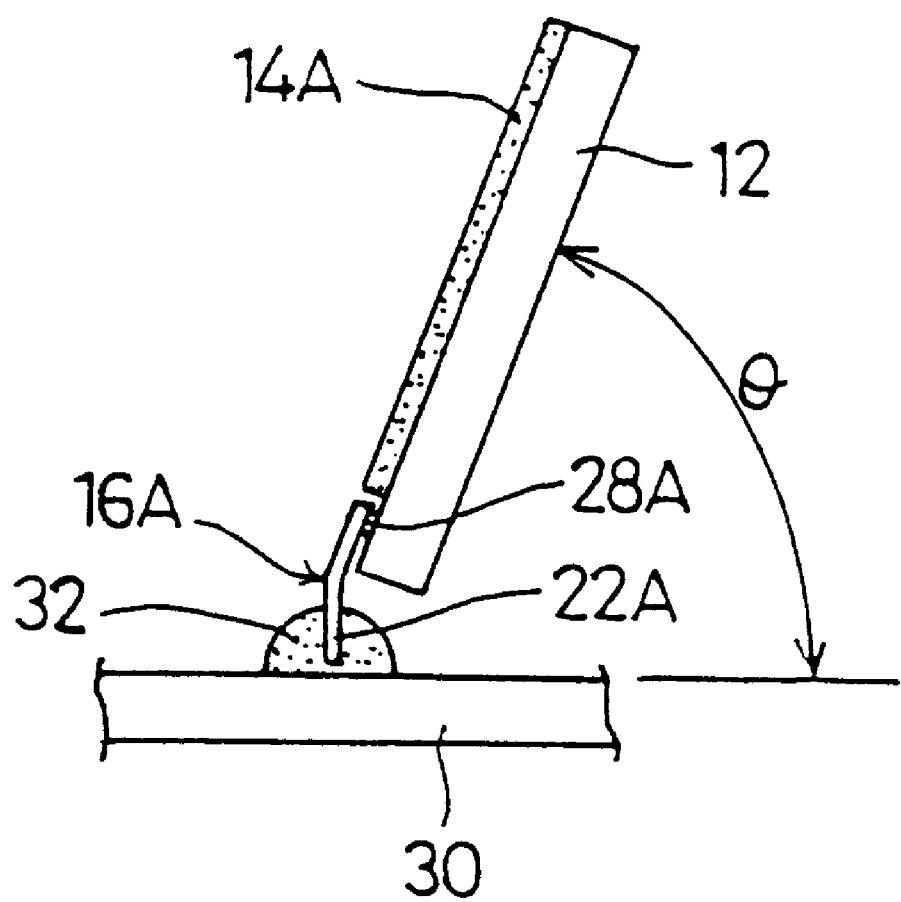
FIG. 3 is a side view of the semiconductor device according to the first embodiment of the present invention in a state in which the device is mounted on a mounting board.

FIGS. 1 through 3 are diagrams of a semiconductor device 10A according to a first embodiment of the present invention. The semiconductor device 10A includes a semiconductor chip 12, a protection cover 14A, and external connection terminals 16A, and thus has a simple structure. FIG. 1 is a perspective view of the semiconductor device 10A, and FIGS. 2 and 3 are diagrams showing a state in which the semiconductor device 10A is mounted on a mounting board 30.

The semiconductor chip 12 functions as a high-speed performance memory having a storage capacity as high as 32 Mbytes or more. The semiconductor chip 12 has a front surface which is a circuit formation surface 21 in which a memory circuit is formed. A plurality of connection parts 18 are aligned along one end (lower end in FIG. 1) of the circuit formation area 21. The connection parts 18 are electrode pads, and protrusion electrodes 28A are formed in upper portions of the connection parts 18.

The protection cover 14A is arranged on the circuit formation area 21 of the semiconductor chip 12. The protection cover 14A can be made of a liquefied coating member having insulation property such as polyimid-based resin, epoxy resin and silicone-based resin. The protection cover 14A can be formed on the semiconductor chip 12 by a spin coat, potting, screen printing or transfer mold.

The protection cover 14A is not disposed to the portion in which the connection parts 18 are provided. Hence, the connection parts 18 are located on an exposed surface portion 20 in which the semiconductor chip 12 is partially exposed. In other words, the protection cover 14A definitely covers the circuit formation area 21 and protects the circuit formed therein. The circuit formation area 21, which is most delicate in the semiconductor chip 12, is covered by the protection cover 14A, so that the reliability of the semiconductor device 10A can be improved.

The external connection terminals 16A are made of a metallic member having a low electrical resistivity such as a copper alloy, and have plated surfaces formed by plating with gold or palladium. Hence, the electrical and mechanical performance can be improved. The external connection terminals 16A have ends joined to the connection parts 18, and are electrically connected to the semiconductor chip 12 by, for example, a thermal crimp process. This thermal crimp process will be described with reference to FIGS. 20 and 21.

Figure 20:
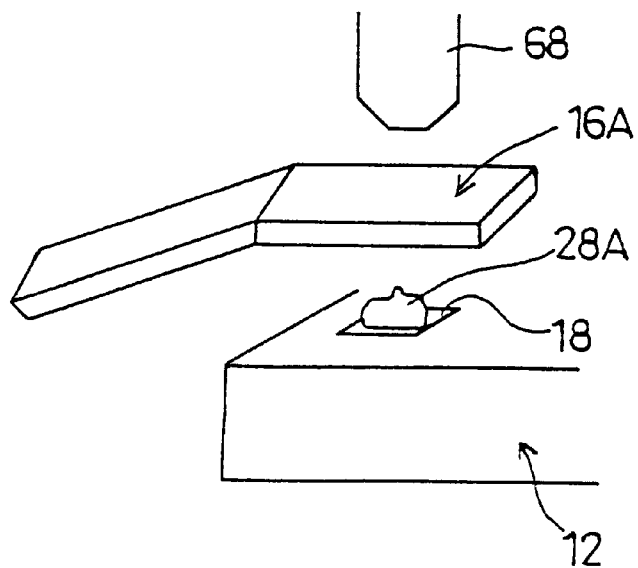
FIG. 20 is a perspective view of a method for connecting an external connection terminal to a connection part.

FIG. 20 shows a state observed just before the external connection terminals 16A are thermally crimped to the connection parts 18. The thermal crimp method is carried out by utilizing a wire bonding apparatus equipped with a bonding head 68. The bonding head 68 is heated to a temperature which enables the protrusion electrodes 28A to be melt by a heating mechanism (not shown). Further, the bonding head 68 is moved by a moving mechanism (not shown) so that the external connection terminals 16A are pressed against the connection parts 18 with a given pressure. The protrusion electrodes 28A can be made of gold or solder.

Figure 21:
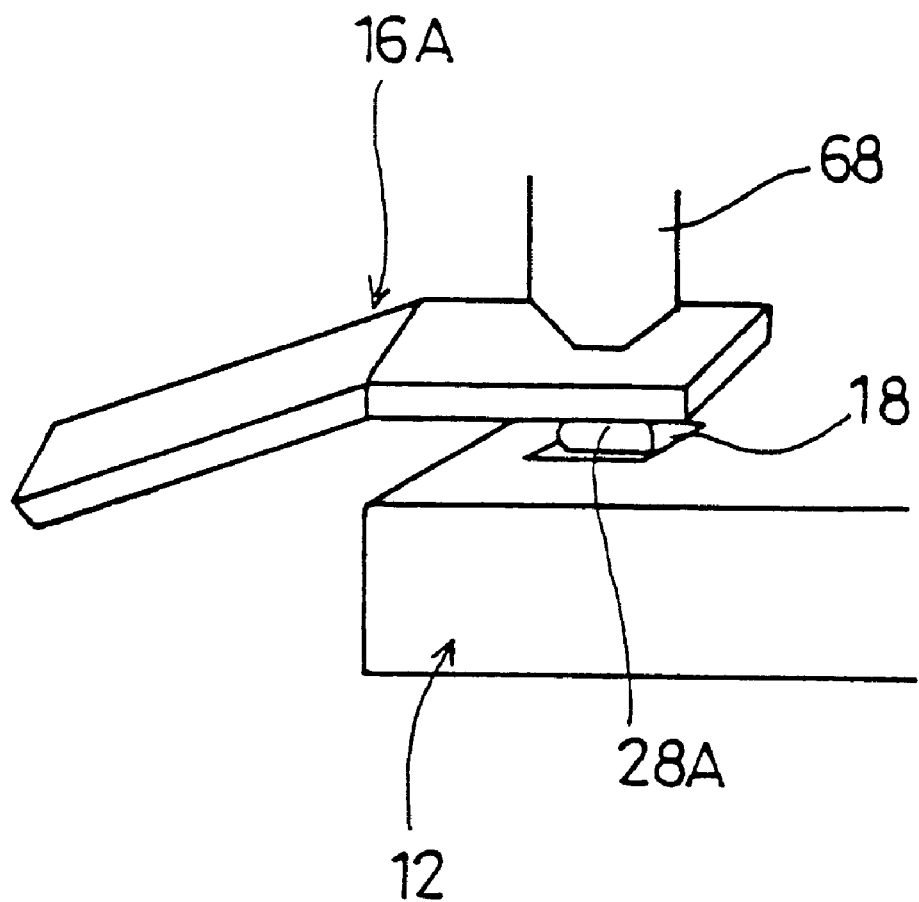
FIG. 21 is another perspective view of the method for connecting the external connection terminal to the connection part.

The thermal crimp process commences to position the connection part 18, the protrusion electrode 28A, the external connection terminal 16A and the bonding head 68 so that they are vertically aligned. Next, as shown in FIG. 21, the bonding head 68 is moved down to crimp the external connection terminal 16A to the protrusion electrode 28A. hence, the head of the bonding head 68 is transferred to the protrusion electrode 28A via the external connection terminal 16A, and the protrusion electrode 28A is thus melted. Finally, the external connection part 16A and the connection part 18 are joined to the protrusion electrode 28A, so that the electrical and mechanical connection can be made.

As described above, the terminal crimp process for joining the external connection terminal 16A to the connection part 18 can be performed by the existing wire bonding apparatus, and realizes the simple and less-expensive joint work.

Turning to FIGS. 1 through 3 again, a further description will be given of the semiconductor device 10.

The external connection terminals 16A connected to the connection parts 18 as described above extend downwards from a lower surface 24 of the semiconductor chip 12. The external connection terminals 16A have bent portions 22A located at intermediate positions thereof. The bent portions 22A forms a given angle θ with respect to the plane surface of the semiconductor chip 12, as shown in FIG. 3.

It can be seen from the above description that the semiconductor device 10A is so-called chip-size package, and the semiconductor chip 12 is not buried in the a resin package. Hence, it is possible to facilitate down-sizing of the semiconductor device 10A.

In the first embodiment of the present invention, the external connection terminals 16A are directly connected to the connection parts 18, so that short electrical transmission lines can be realized, as compared to the prior art arrangement in which the wires are sued to connect the leads (which correspond to the external connection terminals 16A) of the semiconductor chip. Further, the external connection terminals 16A configured in the first embodiment have a minimum length sufficient to connect the semiconductor chip 12 (connection parts 18) to the mounting board 30. Furthermore, the external connection terminals 16A is made of a copper alloy, which has a low electrical resistivity.

Hence, it is possible to extremely reduce the electrical resistivity of the external connection terminals 16A and simultaneously reduce the lengths of the electrical transmission lines. As a result, the whole electrical transmission lines have an extremely reduced electrical resistance, which contributes to increasing the operation speed of the semiconductor chip 12 serving as a high-speed performance memory. hence, even if the semiconductor device 12 is driven at a high driving frequency, only an extremely reduced loss occurs in the electrical transmission lines and high-speed process can be realized.

The semiconductor device 10A can be mounted as follows.

FIG. 2 shows a mount state in which the semiconductor chip 12 stands vertically on the mounting board 30. In FIG. 2, the external connection terminal 16A is soldered to the mounting board 30 by solder 32. Alternatively, a socket can be used to mount the chip 12 on the mounting board 30. The bent portion 22A of the external connection terminal 16A is inclined with respect to the mounting board 30 and is soldered.

The above arrangement in which the semiconductor device 10A stands vertically on the mounting board 30 makes it possible to reduce the space for mounting (mounting area) on the mounting board 30 and mount a plurality of semiconductor devices 10A at an increased density.

In the prior art, semiconductor devices are arranged in a stacked formation in order to increase the storage capacity. In contrast, a plurality of semiconductor devices 10A are mounted on the mounting board 30 so as to stand vertically so that a storage capacity thus obtained can be equal to or greater than that obtained in the stacked formation.

FIG. 3 shows the semiconductor chip 12 is mounted on the mounting board 30 so that it is included at an angle θ. In this arrangement, the bent portion 22A of the external connection terminal 16A stands vertically on the mounting board 30 and is soldered thereto. The arrangement shown in FIG. 3 reduces the height of the semiconductor device 10A, as compared to the arrangement shown in FIG. 2, so that a reduction in the height and an increase in the storage capacity can simultaneously be realized.

A description will now be given of a second embodiment of the present invention.

Figure 4:
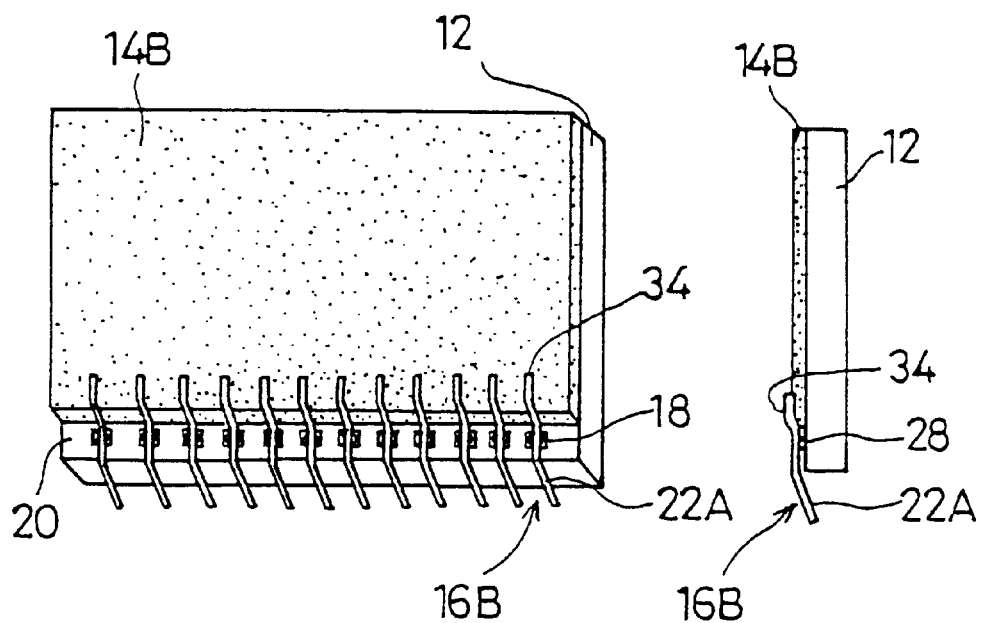
FIG. 4A is a perspective view of a semiconductor device according to a second embodiment of the present invention.
FIG. 4B is a side view of the semiconductor device according to the second embodiment of the present invention.

FIGS. 4A and 4B show a semiconductor device 10B according to the second embodiment of the present invention. In FIGS. 4A and 4B, parts that are the same as those of the semiconductor device 10A of the first embodiment of the present invention shown in FIGS. 1 through 3 are given the same reference numbers, and a description thereof will be omitted.

The semiconductor device 10B has a feature in which held portions 34 are formed in external connection terminals 16B, and a protection cover 14B is made of a material having adhesiveness.

The held portions 34 are formed integrally with the external connection terminals 16B, and extend upwards from the connection parts 18 so that the held portions 34 extend on the protection cover 14B.

The protection cover 14B is formed of a heat reversible resin having an adhesive property. The held portions 34 of the external connection terminals 16B are adhered to the protection cover 14B. Hence, the held portions 34 are supported by the protection cover 14B. Thus, the external connection terminals 16B are held by the semiconductor chip 12 by joining force produced by the connection parts 18 and holding force due to the protection cover 14B.

With the above arrangement, the external connection terminals 16B can be more certainly fixed to the semiconductor chip 12 and can definitely be prevented from being detached therefrom. As a result, the semiconductor device 10B has improved reliability.

The protection cover 14B is formed of a material having a material having adhesiveness, and the process for adhering the held portions 34 is carried out under a heated environment. The resin forming the protection cover 14B is not made soft at an environment temperature at which the semiconductor device 10B is used. Hence, dust does not adhere to the protection cover 14B of the semiconductor device 10B.

Figure 5:
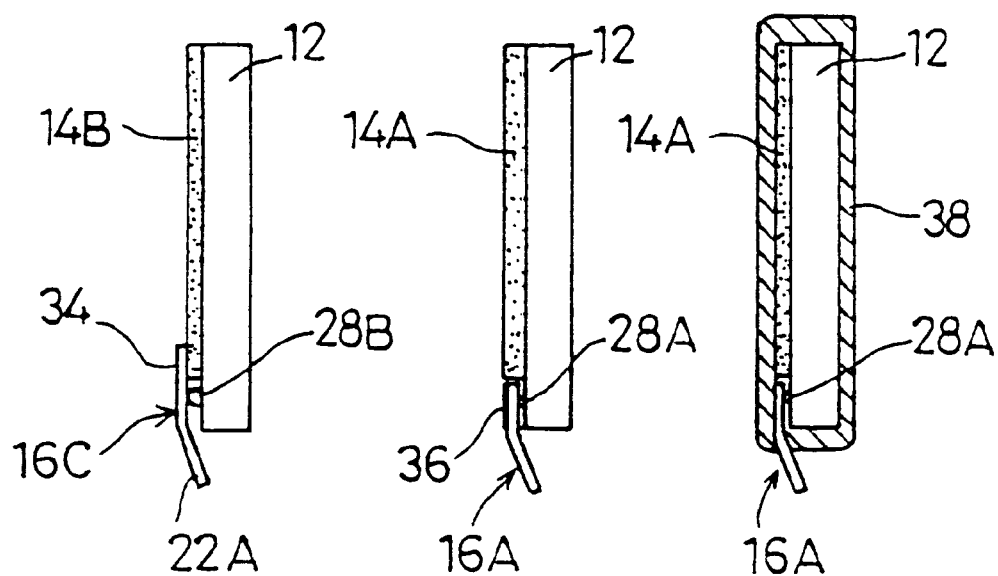
FIGS. 5A, 5B and 5C are respectively side views of variants of the semiconductor device according to the second embodiment of the present invention.

FIGS. 5A, 5B and 5C show variants of the semiconductor device 10B according to the second embodiment of the present invention.

FIG. 5A shows a semiconductor device 10C in which the height of the protrusion electrode 28B to which a connection terminal 16C is joined is equal to the thickness of the protection cover 14B. Hence, the external connection terminal 16C can have a straight shape and can be thus formed easily.

FIG. 5B shows a semiconductor device 10D, which employs the external connection terminal 16A used in the first embodiment of the present invention. A cover resin 36 is disposed to a front surface portion of the external connection terminal 16A (surface opposite to the surface to which the protection electrode 28A is provided). The cover resin 36 is integrated with the resin cover 14A. Hence, the cover resin 36 covers and protects the joint portion of the external connection terminal 16A and the protrusion electrode 28A and the vicinity thereof. With the above arrangement, it is possible to prevent the external connection terminal 16A from being detached from the semiconductor chip 12.

FIG. 5C shows a semiconductor device 10E, which employs the external connection terminal 16A used in the first embodiment of the present invention and a sealing resin 38 provided so as to cover the whole surfaces thereof so that the external connection terminal 16A partially extends downwards from the lower surface of the sealing resin 38.

With the above arrangement, a part of the external connection terminal 16A is held by the sealing resin 38, and is thus prevented from being detached from the semiconductor chip 12. Further, the semiconductor chip 12 is protected by the sealing resin 38 as well as the protection cover 14A, so that the reliability of the semiconductor device 10E can be improved.

A description will now be given of a third embodiment of the present invention.

Figure 6:
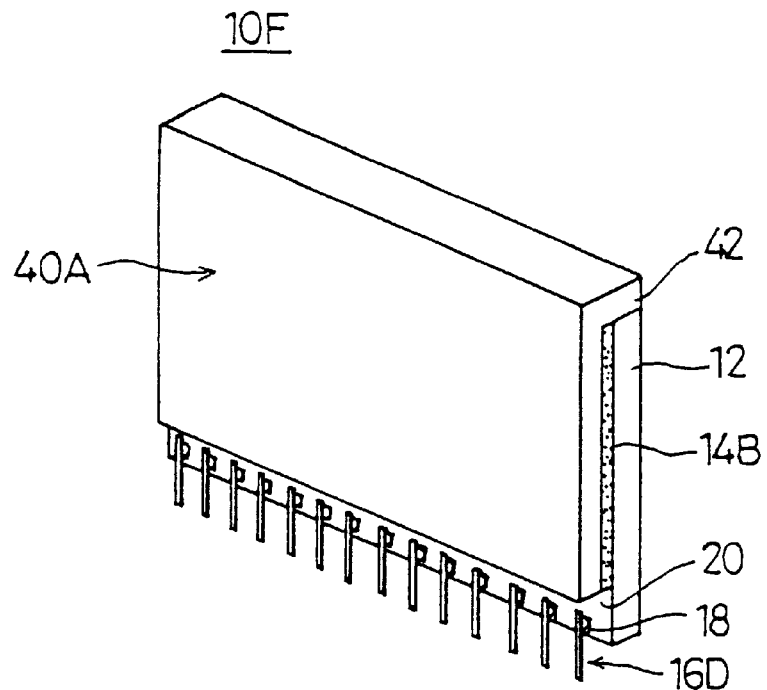
FIG. 6 is a perspective view of a semiconductor device according to a third embodiment of the present invention.

FIG. 6 shows a semiconductor device 10F according to the third embodiment of the present invention. In FIG. 6, parts that are the same as those of the semiconductor device 10A according to the first embodiment of the present invention are given the same reference numbers, and a description thereof will be omitted.

The semiconductor device 10F has a heat radiating plate 40A, which can be made of a metallic material having a good thermal conductivity, such as aluminum. The heat radiating plate 40A has a L shape having a flange 42. The flange 42 also functions to protect the upper surface 26 of the semiconductor chip 12. The heat radiating plate 40A does not cover the exposed surface portion.

The heat radiating plate 40A faces the protection cover 14B, which is the same as that used in the second embodiment of the present invention. That is, the protection cover 14B has a heat reversible property and also functions as an adhesive. Hence, the protection plate 40A faces the circuit formation surface 21 of the semiconductor chip 12 via the protection cover 14B.

The protection cover 14B functions to protect the circuit formation surface 21 and fix the heat radiating plate 40A to the semiconductor chip 12. Thus, it is possible to reduce the number of components and the number of assembly steps. The heat radiating plate 40A is disposed so as to face the circuit formation surface 21, which emits the largest amount of heat in the semiconductor chip 12. Thus, heat generated in the circuit formation surface 21 is efficiently transferred to the heat radiating plate 40A via the protection cover 14B, so that the heat radiating efficiency can be improved.

Figure 7:
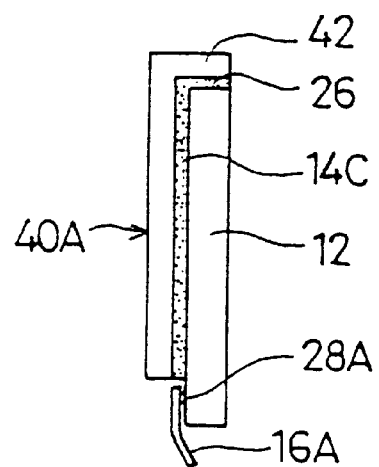
FIG. 7 is a side view of a variant of the semiconductor device according to the third embodiment of the present invention
Figure 8:
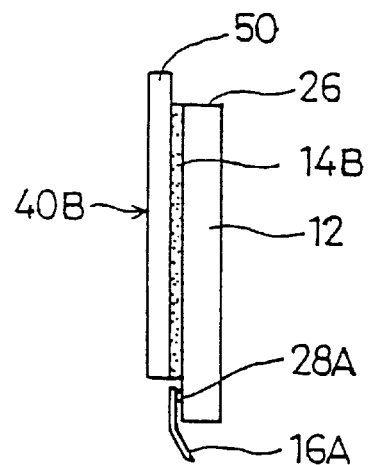
FIG. 8 is a side view of another variant of the semiconductor device according to the third embodiment of the present invention.

FIGS. 7 and 8 show variants of the semiconductor device 10F according to the third embodiment of the present invention.

A semiconductor device 10G shown in FIG. 7 has a protection cover 14C, which covers not only the circuit formation surface 21 of the semiconductor chip 12 but also the upper surface 26 thereof. Hence, it is possible to more certainly join the semiconductor chip 12 and the heat radiating plate 40A together.

A semiconductor device 10H shown in FIG. 8 has a heat radiating plate 40B, which has an extending portion 50 extending outwards (upwards) from the upper surface 26 of the semiconductor chip 12. The extending portion 50 serves as a positional reference which can be used when the semiconductor device 10H is mounted on the mounting board 30.

Hence, it is possible to mount the semiconductor device 10H on the mounting board 30 with high precision. Further, the heat radiating plate 40B has an increased area, which increases the heat radiating efficiency.

A description will now be given of a fourth embodiment of the present invention.

Figure 9:
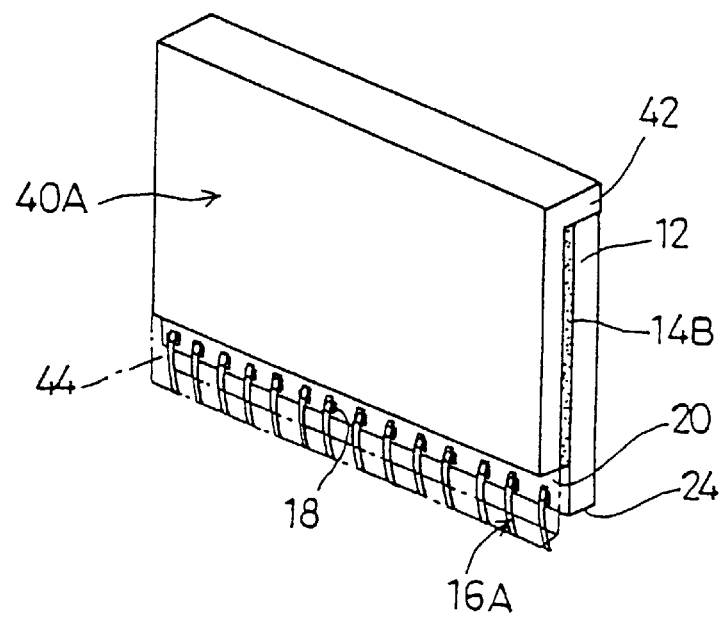
FIG. 9 is a perspective view of a semiconductor device according to a fourth embodiment of the present invention.
Figure 10:
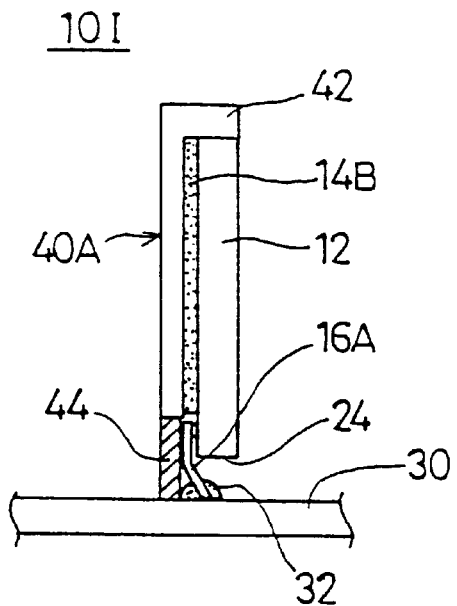
FIG. 10 is a side view of the semiconductor device according to the fourth embodiment of the present invention in a state in which the device is mounted on a mounting board.

FIGS. 9 and 10 show a semiconductor device 10I according to the fourth embodiment of the present invention. FIG. 9 is a perspective view of the semiconductor device 10I, and FIG. 10 shows a state in which the semiconductor device 10I is mounted on the mounting board 30. In FIG. 9, parts that are the same as those of the semiconductor device 10A according to the first embodiment of the present invention shown in FIGS. 1 through 3 are given the same reference numbers, and a description thereof will be omitted.

The semiconductor device 10I has a supporting resin 44, which is disposed to the heat radiating plate 40A and extends up to the end positions of the external connection terminals 16A. The supporting resin 44 has a thickness approximately equal to that of the heat radiating plate 40A, and is fastened to the lower surface of the heat radiating plate 40A by an adhesive.

Hence, the external connection terminals 16A are located between the semiconductor chip 12 and the supporting resin 44. The supporting resin 44 is formed of a resin having a predetermined hardness. Hence, the supporting resin 44 can be used as a supporting member which supports the semiconductor chip 12.

As shown in FIG. 10, in the state in which the semiconductor device 10I is mounted on the mounting board 30, the semiconductor chip 12 is supported by not only the external connection terminals 16A but also the heat radiating plate 40A via the supporting resin 44.

Hence, it is possible to certainly mount the semiconductor device 10I on the mounting board 30 and to improve the mounting reliability. Before mounting, the supporting resin 44 protects the external connection terminals 16A, so that the external connection terminals 16A can be prevented from being deformed due to external force or the like.

Figure 11:
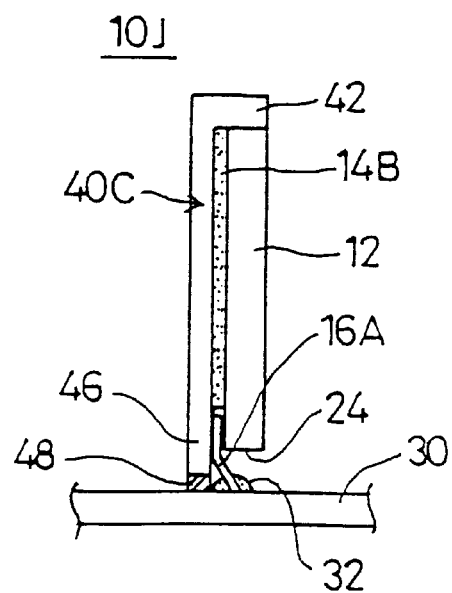
FIG. 11 is a side view of a variant of the semiconductor device according to the fourth embodiment of the present invention.

FIG. 11 shows a variant of the semiconductor device 10I according to the fourth embodiment of the present invention. A semiconductor device 10J of this variant has a supporting portion 46, which is a portion of the heat radiating plate 40C and extends to the end positions of the external connection terminals 16A. The supporting portion 46 is formed integrally with the heat radiating plate 40C, whereby the semiconductor device 10J can be produced by a reduced number of components and a reduced number of steps, as compared to the semiconductor device 10I.

As described above, the supporting portion 46 is configured so that the heat radiating plate 40C extends to the end positions of the external connection terminals 16A, the semiconductor chip 12 of the semiconductor device 10J mounted on the mounting board 30 is supported by not only the external connection terminals 16A but also the supporting portion 46 (the heat radiating plate 40C). Hence, the semiconductor device 10J is certainly mounted on the mounting board 30, so that the reliability of mounting can be improved and the external connection terminals 16A can be prevented from being deformed.

A description will be described of a fifth embodiment of the present invention.

Figure 12A:
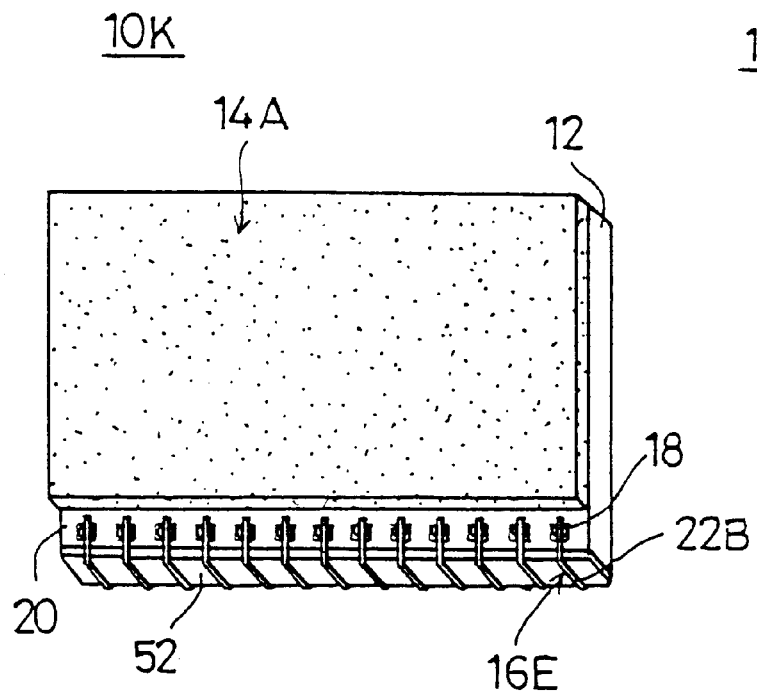
FIG. 12A is a perspective view of a semiconductor device according to a fifth embodiment of the present invention.
Figure 12B:
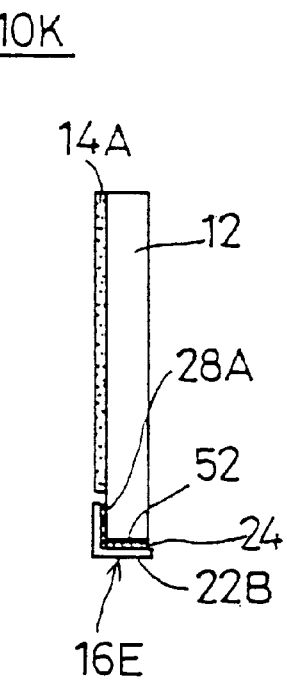
FIG. 12B is a side view of the semiconductor device according to the fifth embodiment of the present invention.

FIGS. 12A and 12B show a semiconductor device 10K according to the fifth embodiment of the present invention. In FIGS. 12A and 12B, parts that are the same as those of the semiconductor device 10A according to the first embodiment shown in FIGS. 1 through 3 are given the same reference numbers, and a description thereof will be omitted.

The semiconductor device 10K has a feature in which the external connection terminals 16E have bent portions 22B which are bent at approximately 90° and are fixed to the lower surface 24 of the semiconductor chip 12. Hence, an adhesive 52 is disposed to fix the bent portions 22B to the lower surface 24 of the semiconductor chip 12.

Hence, the bent portions 22B are supported by the semiconductor chip 12. Hence, when the semiconductor chip 12 becomes highly integrated and an increased number of pins is required so that the pitch between the adjacent external connection terminals 16E becomes narrower, it is possible to prevent occurrence of an interference between the external connection terminals 16E.

Figure 13:
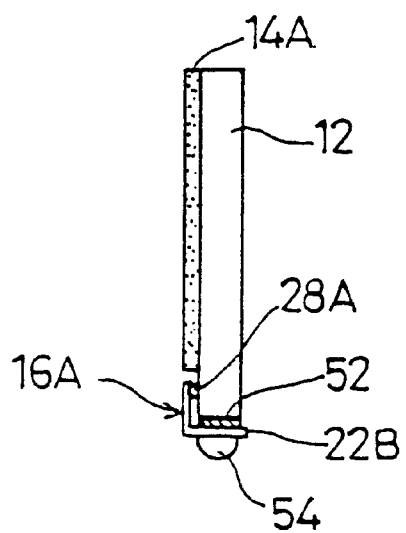
FIG. 13 is a side view of a variant of the semiconductor device according to the fifth embodiment of the present invention.
Figure 14:
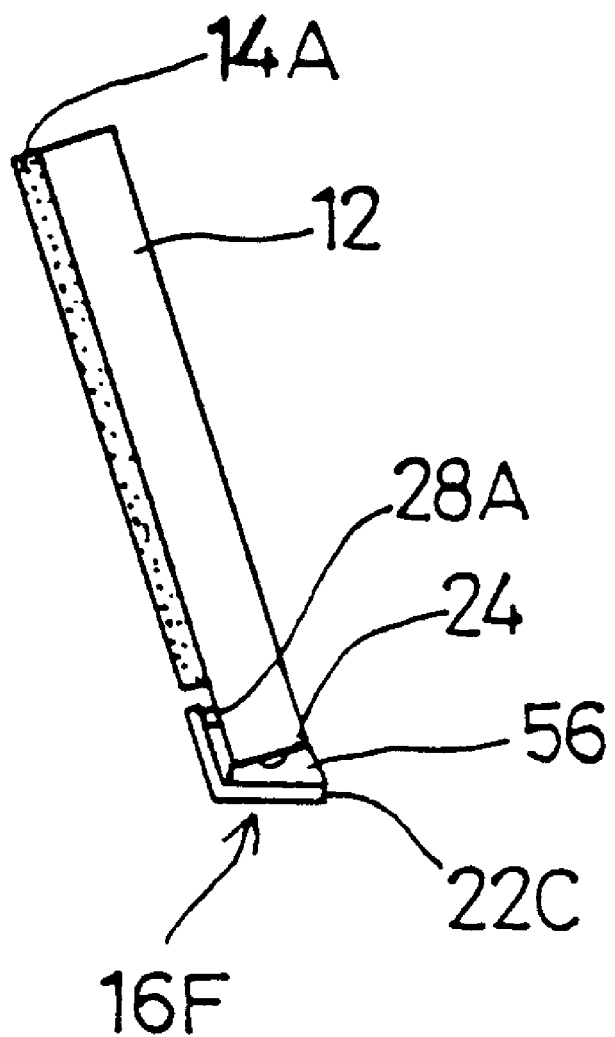
FIG. 14 is a side view of another variant of the semiconductor device according to the fifth embodiment of the present invention.

FIGS. 13 and 14 shows variations of the semiconductor device 10K according to the fifth embodiment of the present invention. A semiconductor device 10L shown in FIG. 13 has an arrangement in which protrusion electrodes 54 are formed on outer surface portions of the bent portions 22B fixed to the lower surface 24 of the semiconductor chip 12.

Hence, the protrusion electrodes 54 project from the bent portions 22B, so that the electrical contactability between the semiconductor device 10L and the mounting board 30 can be improved.

A semiconductor device 10M shown in FIG. 14 has an arrangement in which a spacer 56 is provided between bent portions 22C of external connection terminals 16F and the lower surface 24 of the semiconductor chip 12. The spacer 56 has a slope which corresponds to the angle at which the bent portions 22C are bent. The spacer 56 may be formed of resin having a heat reversible property and functioning as an adhesive. Alternatively, the spacer 56 may be formed of an insulating member, which is adhered to the lower surface 24 and the bent portions 22C.

The spacer 56 makes it possible to mount the semiconductor device 10M on the mounting board 30 at the inclined state. Further, it is possible to reduce the height of the semiconductor device 10M measured from the upper surface of the mounting board 30 to the upper portion of the semiconductor device 10M. Furthermore, the spacer 56 functions to stably fix the semiconductor device 10M to the mounting board 30, as compared with the mounting structure shown in FIG. 3.

A description will now be given of a sixth embodiment of the present invention.

Figure 15A:
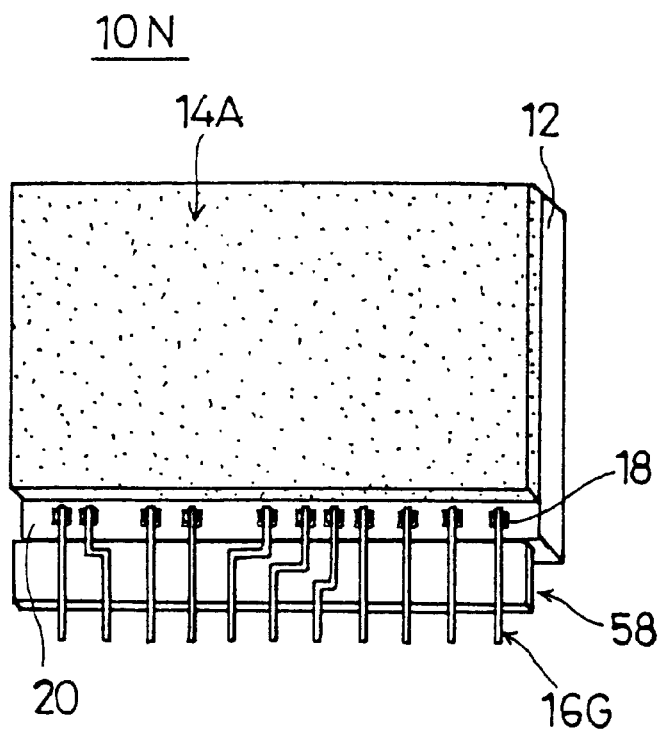
FIG. 15A is a perspective view of a semiconductor device according to a sixth embodiment of the present invention.
Figure 15B:
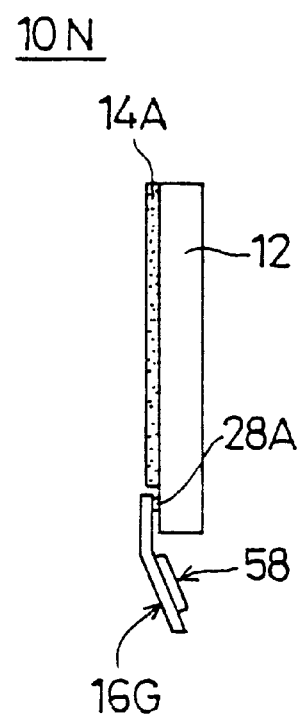
FIG. 15B is a side view of the semiconductor device according to the sixth embodiment of the present invention.

FIGS. 15A and 15B show a semiconductor device 10N according to a sixth embodiment of the present invention. In FIGS. 15A and 15B, parts that are the same as those of the semiconductor device 10A according to the first embodiment of the present invention are given the same reference numbers, and a description thereof will be omitted.

The semiconductor device 10N has an arrangement in which external connection terminals 16G are held by a holding board 58 provided separately form the semiconductor chip 12. The holding board 58 can be formed of an arbitrary board because it is separated from the semiconductor chip 12.

For example, the holding board 58 can be formed of a printed wiring board, a flexible circuit board, a ceramic circuit board, or a TAB (Tape Automated Bonding) tape. Further, the holding board 58 has a single-layer wiring structure or a multi-layer wiring structure.

The external connection terminals 16G are held by the holding plate 58 provided separated from the semiconductor chip 12 so that the external connection terminals 16G can be protected. Hence, when the semiconductor chip 12 is highly integrated and an increased number of pins is required so that the pitch between the adjacent external connection terminals 16G becomes narrower, it is possible to prevent occurrence of an interference between the external connection terminals 16G.

The holding board 58 makes it possible to flexibly arrange the external connection terminals 16G thereon and thus improve the degree of freedom in designing the arrangement of the external connection terminals 16G. This will be described below with reference to FIG. 16.

Figure 16:
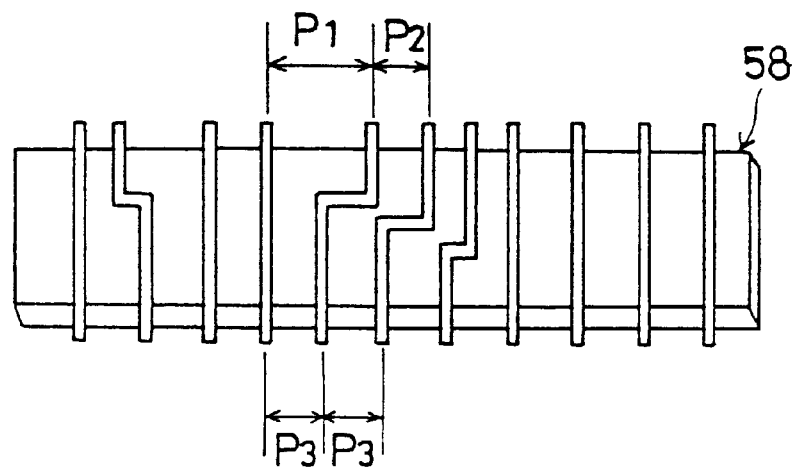
FIG. 16 is an enlarged perspective view of a holding board used in the semiconductor device according to the sixth embodiment of the present invention.

FIG. 16 is an enlarged view of the holding board 58. The upper side of the figure is a side on which connections with the connection parts 18 should be made, and the lower side thereof is another side on which connections with the mounting board 30 should be made. As has been described previously, the connection parts 18 are formed on the circuit formation surface 21 of the semiconductor chip 12, and there is thus a possibility that the positions of the connection parts 18 may be restricted and an equal pitch between the adjacent connection parts 18 may not be obtained. In addition, there is another restriction in which the ends of the external connection terminals 16G arranged on the side on which the connections with the connection parts 18 should be made correspond to the positions of the connection parts 18. Hence, if the connection parts 18 are not arranged at an equal pitch, the ends of the external connection terminals 16G are not arranged at an equal pitch, as shown in FIG. 16 (refer to arrows P1 and P2 in this figure).

Also, the other ends of the external connection terminals 16G are required to correspond to the positions of terminals mounted on the mounting board 30. If the terminals mounted on the mounting board 30 are arranged at an equal pitch (indicated by an arrow P3 in FIG. 16), a difficulty may occur in any of the aforementioned embodiments of the present invention.

The holding board 58 enables the external connection terminals 16G to be arbitrarily arranged thereon. Hence, as shown in FIG. 16, it is possible to realize an arrangement in which the pitches P1 and P2 of the external connection terminals 16G on the side of the connection parts 18 differ from the pitch P3 of the external connection terminals 16F on the side of the mounting board 30.

As described above, the holding board 58 contributes to increasing the degree of freedom in design of the wiring arrangement for the semiconductor device 10N. When the holding board 58 has a multi-layer wiring structure, it is possible to arbitrarily select the wiring layout between layers arranged in a stacked formation and further improve the degree of freedom in wiring design. Further, the external connection terminals 16G are held by the holding board 58. Hence, when the semiconductor chip 12 is highly integrated and an increased number of pins is required so that the pitch between the adjacent external connection terminals 16G becomes narrower, it is possible to prevent occurrence of an interference between the external connection terminals 16G.

Figure 17:
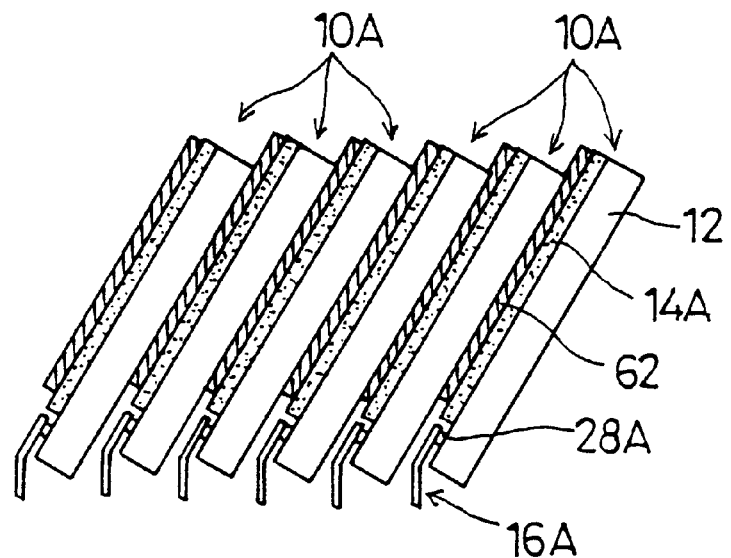
FIG. 17 is a side view of a semiconductor device module according to a seventh embodiment of the present invention.
Figure 18:
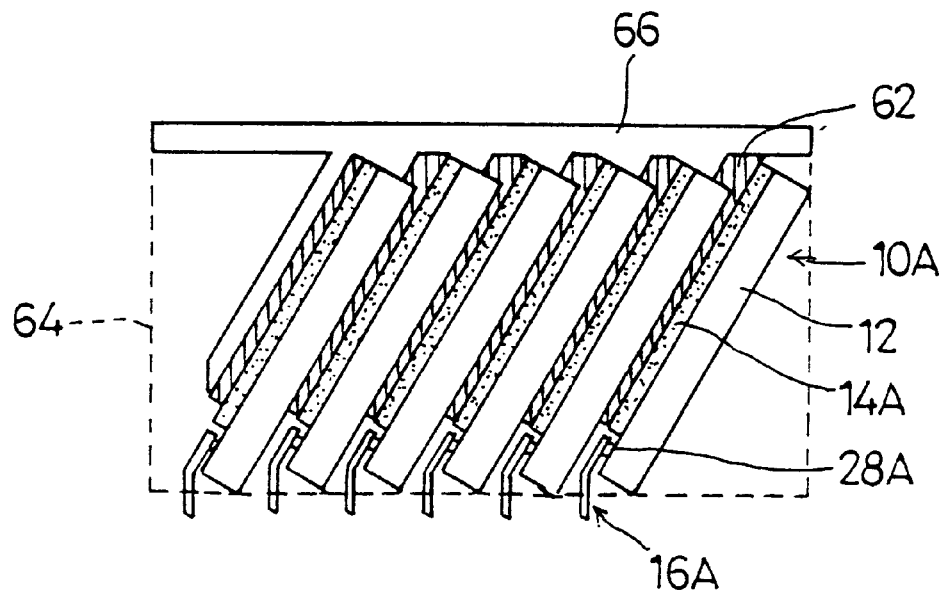
FIG. 18 is a side view of a semiconductor device module according to an eighth embodiment of the present invention.
Figure 19:
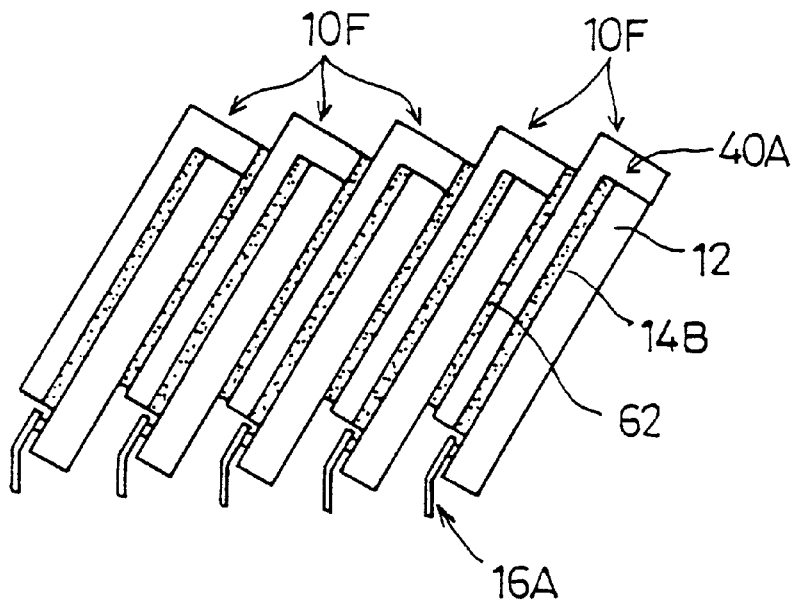
FIG. 19 is a side view of a semiconductor device module according to a ninth embodiment of the present invention.

A description will now be given, with reference to FIGS. 17 through 19, of semiconductor device modules 60A–60C. In FIGS. 17 through 19, parts that are the same as those of the semiconductor devices 10A–10N according to the first through sixth embodiments of the present invention shown in FIGS. 1 through 16 are given the same reference numbers, and a description thereof will be omitted.

FIG. 17 shows a semiconductor device module 60A according to a seventh embodiment of the present invention.

The semiconductor device module 60A includes a plurality of semiconductor devices 10A shown in FIG. 1 arranged side by side. An adhesive 62 is used to fix the semiconductor devices 10A together so that the semiconductor device module 60A is configured. With the above arrangement, it is possible to reduce the whole size and realize the high-capacity, high-speed semiconductor device module 60A. In addition, the semiconductor devices 10A are arranged so as to be inclined, and thus the semiconductor device module 60A has a reduced height.

The semiconductor devices 10A used in the structure shown in FIG. 17 can be replaced by any of the aforementioned semiconductor devices 10B through 10N.

FIG. 18 shows a semiconductor device module 60B according to an eighth embodiment of the present invention.

The semiconductor device module 60B has an arrangement in which the semiconductor device module 60A shown in FIG. 17 is housed and held in a carrier 64, and a heat radiating member 66 is disposed so as to cover the upper portions of the devices 10A. The heat radiating member 66 is formed of a metallic material having a high thermal conductivity such as aluminum, and is fixed by the adhesive 62 used to fix the semiconductor devices 10A together.

With the above arrangement, it is possible to place the semiconductor devices 10A in a position and hold them. Hence, the semiconductor devices 10A are arranged side by side, nevertheless the external connection terminals 16A can be positioned precisely. This facilitates the mounting work of the module on the mounting board 30.

The heat radiating member 66 arranged so as to cover the upper portions of the semiconductor devices 10A improves the heat radiating efficiency. The semiconductor devices 10A generate a large amount of heat, and are arranged side by side so as to be in close contact with each other. The above fact may be directed to degrading the heat radiating efficiency. However, the heat radiating member 66 is provided so as to cover the upper portions of the semiconductor devices 10A, whereby the heat generated by the semiconductor devices 10A can be efficiently transferred to the heat radiating member 66 and can be radiated. As a result, the semiconductor devices 10A can definitely be cooled.

The structure shown in FIG. 18 employs the semiconductor devices 10A configured according to the first embodiment of the present invention. Alternatively, the semiconductor devices 10A can be replaced by any of the aforementioned semiconductor devices 10B through 10N.

FIG. 19 shows a semiconductor device module 60C according to a ninth embodiment of the present invention.

The semiconductor device module 60C has a plurality of semiconductor devices 10F of the third embodiment of the present invention shown in FIG. 6. The semiconductor devices 10F are arranged side by side and are fixed together by the protection covers 14B, which are used as an adhesive. Hence, the semiconductor device module 60C can be produced by a reduced number of components and a simplified assembly work, as compared to an arrangement in which an adhesive is used separately from the protection covers 14B. Further, the semiconductor devices 10F are equipped with the respective heat radiating plates 40A, so that the heat radiating efficiency of the whole semiconductor device module 60C can be improved.

The semiconductor devices 10F used in the ninth embodiment of the present invention shown in FIG. 19 can be replaced by any of the semiconductor devices 10G–10J.

The present invention is not limited to the specifically disclosed embodiments and variations thereof, and other variations and modifications may be made without departing from the scope of the present invention.

What is claimed is:

1. A semiconductor device comprising:
   a semiconductor chip having a circuit formation surface having a first surface portion covered by a protection cover and a second surface portion not covered by the protection cover;
   connection parts arranged on said second surface portion on one end of the semiconductor chip; and
   external connection terminals having first portions extending from the connection parts on the second surface portion and second portions oriented inwardly with respect to the circuit formation surface.

2. The semiconductor device as claimed in claim 1, further comprising protrusion electrodes joining the connection parts and the external connection terminals together.

3. The semiconductor device as claimed in claim 1, wherein the external connection terminals are thermally crimped to the connection parts.

4. The semiconductor device as claimed in claim 1, wherein:
   the semiconductor chip can be mounted on a mounting board so as to stand vertically; and
   the semiconductor chip has a memory chip.

* * * * *